(12) United States Patent
Parekh et al.

(10) Patent No.: US 8,629,527 B2
(45) Date of Patent: Jan. 14, 2014

(54) SEMICONDUCTOR STRUCTURES

(75) Inventors: Kunal R. Parekh, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/181,661

(22) Filed: Jul. 13, 2011

(65) Prior Publication Data

US 2011/0266647 A1    Nov. 3, 2011

Related U.S. Application Data

(62) Division of application No. 12/114,932, filed on May 5, 2008, now Pat. No. 7,989,307.

(51) Int. Cl.
*H01L 21/00* (2006.01)

(52) U.S. Cl.
USPC ........... 257/506; 257/244; 257/329; 438/424; 438/427

(58) Field of Classification Search
USPC .................. 257/506, 244, 329; 438/424, 427
See application file for complete search history.

(56) References Cited

U.S. PATENT DOCUMENTS

| | | | |
|---|---|---|---|
| 4,910,168 A | 3/1990 | Tsai | |
| 5,013,680 A | 5/1991 | Lowrey et al. | |
| 5,047,117 A | 9/1991 | Roberts | |
| 5,254,218 A | 10/1993 | Roberts et al. | |
| 5,328,810 A | 7/1994 | Lowrey et al. | |
| 5,372,916 A | 12/1994 | Ogawa et al. | |
| 5,382,315 A | 1/1995 | Kumar | |
| 5,420,067 A | 5/1995 | Hsu | |
| 5,429,988 A | 7/1995 | Huang et al. | |
| 5,573,837 A | 11/1996 | Roberts et al. | |
| 5,593,813 A | 1/1997 | Kim | |
| 5,616,510 A * | 4/1997 | Wong | 438/259 |
| 5,905,279 A | 5/1999 | Nitayama et al. | |
| 5,916,821 A | 6/1999 | Kerber | |
| 6,063,688 A | 5/2000 | Doyle et al. | |
| 6,087,263 A | 7/2000 | Clampitt et al. | |
| 6,140,217 A | 10/2000 | Jones et al. | |
| 6,207,490 B1 | 3/2001 | Lee | |
| 6,235,574 B1 | 5/2001 | Tobben et al. | |
| 6,249,335 B1 | 6/2001 | Hirukawa et al. | |
| 6,303,272 B1 | 10/2001 | Furukawa et al. | |

(Continued)

FOREIGN PATENT DOCUMENTS

| | | |
|---|---|---|
| CN | 1550889 | 12/2004 |
| CN | 1752844 | 3/2006 |

(Continued)

OTHER PUBLICATIONS

PCT/US2007/015729, Jan. 2, 2008, Written Opinion.

(Continued)

*Primary Examiner* — Jarrett Stark
*Assistant Examiner* — Nicholas Tobergte
(74) *Attorney, Agent, or Firm* — Wells St. John, P.S.

(57) ABSTRACT

Methods of pitch doubling of asymmetric features and semiconductor structures including the same are disclosed. In one embodiment, a single photolithography mask may be used to pitch double three features, for example, of a DRAM array. In one embodiment, two wordlines and a grounded gate over field may be pitch doubled. Semiconductor structures including such features are also disclosed.

19 Claims, 17 Drawing Sheets

(56) References Cited

U.S. PATENT DOCUMENTS

| | | | |
|---|---|---|---|
| 6,352,932 B1 | 3/2002 | Clampitt et al. |
| 6,383,952 B1 | 5/2002 | Subramanian et al. |
| 6,429,123 B1 | 8/2002 | Tseng |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Juengling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 7,023,069 B2 * | 4/2006 | Blanchard ............ 257/510 |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Busch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,314,810 B2 | 1/2008 | Jung et al. |
| 7,320,911 B2 | 1/2008 | Basceri et al. |
| 7,339,252 B2 * | 3/2008 | Blanchard ............ 257/510 |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,842,601 B2 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,897,460 B2 | 3/2011 | Parekh et al. |
| 7,923,371 B2 | 4/2011 | Shinohe |
| 8,067,286 B2 | 11/2011 | Parekh et al. |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,440,576 B2 | 5/2013 | Hong |
| 2002/0037617 A1 | 3/2002 | Kim et al. |
| 2002/0043690 A1 | 4/2002 | Doyle et al. |
| 2002/0130348 A1 | 9/2002 | Tran |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jim |
| 2005/0214683 A1 | 9/2005 | Nishimura et al. |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |

(56) References Cited

U.S. PATENT DOCUMENTS

| | | |
|---|---|---|
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1* | 1/2008 | Yang et al. ............... 365/185.26 |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kinm et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0291397 A1 | 11/2009 | Devilliers |
| 2009/0298274 A1 | 12/2009 | Kajiwara |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1* | 1/2011 | Ohta et al. .................... 257/329 |
| 2011/0127677 A1 | 6/2011 | Konishi |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 201080013110.1 | 5/2013 |
| CO | 200980148590.X | 2/2013 |
| EP | 0171111 | 2/1986 |
| EP | 1273974 | 1/2003 |
| EP | 09830819 | 3/2013 |
| EP | 10756541 | 5/2013 |
| EP | 09743197 | 6/2013 |
| EP | 09830818.2 | 7/2013 |
| EP | 098308190 | 8/2013 |
| JP | 56046531 | 4/1981 |
| JP | 58157135 | 9/1983 |
| JP | 59211231 | 11/1984 |
| JP | 64035916 | 3/1989 |
| JP | 1292829 | 11/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2005-243681 | 9/2005 |
| JP | 2006245625 | 9/2006 |
| JP | 2007017993 | 1/2007 |
| JP | 2007-294511 | 11/2007 |
| JP | 2007305976 | 11/2007 |
| JP | 2008-072097 | 3/2008 |
| JP | 2008-072101 | 3/2008 |
| JP | 2009-0289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| SG | 201300853-7 | 6/2013 |
| TW | 098113229 | 9/2012 |
| TW | 098139941 | 12/2012 |
| WO | WO 2006/014654 A1 | 10/2006 |
| WO | WO2007/027558 | 3/2007 |
| WO | WO 2008/008338 | 1/2008 |
| WO | WO 2008/059440 | 5/2008 |
| WO | PCT/US2010/025495 | 9/2011 |

OTHER PUBLICATIONS

PCT/US2007/015729, Jan. 2, 2008, Search Report.
PCT/US2009/039793, Oct. 30, 2009, Written Opinion.
PCT/US2009/039793, Oct. 30, 2009, Search Report.
PCT/US2009/039793, Nov. 18, 2010, IPRP.
PCT/US2009/041500, Dec. 7, 2009, Written Opinion.
PCT/US2009/041500, Dec. 7, 2009, Search Report.
PCT/US2009/041500, Dec. 2, 2010, IPRP.
PCT/US2009/063978, May 31, 2010, Written Opinion.
PCT/US2090/063978, May 31, 2010, Search Report.
PCT/US2009/063978, Jun. 16, 2011, IPRP.
PCT/US2009/063999, May 31, 2010, Written Opinion.
PCT/US2009/063999, May 31, 2010, Search Report.
PCT/US2009/063999, Jun. 16, 2011, IPRP.
PCT/US2009/064004, May 31, 2010, Written Opinion.
PCT/US2009/064004, May 31, 2010, Search Report.
PCT/US2009/064004, Jun. 16, 2011, IPRP.
PCT/US2010/025495, Sep. 29, 2010, Written Opinion.
PCT/US2010/025495, Sep. 29, 2010, Search Report.
PCT/US2010/055488, Jun. 27, 2011, Written Opinion.
PCT/US2010/055488, Jun. 27, 2011, Search Report.
U.S. Appl. No. 13/101,485, filed May 5, 2011, Light et al.
Alapati et al., U.S. Appl. No. 11/714,378, filed Mar. 5, 2007, "Preliminary Amendment filed Mar. 5, 2007", 13 pgs.
Clariant, "Polysilazane SODs Spinful 400 Series for STI/PMD Application", at least as early as Oct. 19, 2009; 1 pp.
Ee et al., "Innovative Solutions to Enhance the Legacy Equipments Towards One Generation Ahead", in Flip chip BGA 0.8mm Ball Pitch Technology; Sep. 2005; 4 pp.

(56) References Cited

OTHER PUBLICATIONS

Fritze et al., "Enhanced Resolution for Future Fabrication", IEEE Circuits & Devices Magazine, Jan. 2003, pp. 43-47.
Gallia et al., "A flexible Gate Array Architecture for High-speed and High-Density Applications", Mar. 1996, pp. 430-436.
Hori et al., "Sub-40nm Half-Pitch Double Patterning with Resist Freezing Process", Proc. of SPIE vol. 6923 (2008) pp. 69230H-1 through 69230H0-8.
Lee et al., "Double-Patterning Technique Using Plasma Treatment of Photoresist", Japanese Journal of Applied Physics, vol. 46, No. 9B, 2007, pp. 6135-6139.
Liau et al., "Softbake and Post-exposure Bake Optimization for Process Window Improvement and Optical Proximity Effect Tuning", ICSE 2006 Proc. 2006, Kuala Lumpur, Malaysia, 7 pgs.
Lu, "Advanced cell structures for dynamic RAMs", Jan. 1989; pp. 27-36.
Ma, "Plasma REsist Image Stabilization Technique (PRIST)", IEEE 1980, pp. 574-575.
Owa et al., "Immersion Lithography Ready for 45nm Manufacturing and Beyond", 2007 IEEE/SEMI Advanced Semiconductor Manufacturing Conference, pp. 238-244.
Pease et al., "Lithography and Other Patterning Techniques for Future Electronics", Proceedings of the IEEE/vol. 96, No. 2, Feb. 2008, pp. 248-270.
Tan et al., "Current Status of Nanonex Nanoimprint Solutions", website: www.nanonex.com/technology.htm 2004, 9 pgs.
Terai et al., "Newly developed RELACS process and materials for 65nm node device and beyond", website: ieeexplore.ieee.org/ie15/10631/335565/01595193.pdf, pp. 20-21, Apr. 9, 2013.
Terai et al., "Newly developed RELACS process and materials for 65nm node device and beyond", website: ieeexplore.ieee.org/ie15/10631/335565/01595193.pdf, Oct. 25-28, 2005; pp. 20-21.

* cited by examiner

SEMICONDUCTOR STRUCTURES

RELATED PATENT DATA

This patent resulted from a divisional application of U.S. patent application Ser. No. 12/114,932, filed May 5, 2008, entitled "Methods of Forming Isolated Active Areas, Trenches, and Conductive Lines in Semiconductor Structures and Semiconductor Structures Including the Same", naming Kunal R. Parekh and John K. Zahurak as inventors, the disclosure of which is incorporated by reference.

TECHNICAL FIELD

Embodiments of the invention relate to integrated circuit fabrication and, more specifically, to methods of forming asymmetric features on semiconductor structures and semiconductor structures including the asymmetric features.

BACKGROUND

As a consequence of many factors, including demand for increased portability, computing power, memory capacity and energy efficiency in modern electronics, integrated circuits are continuously being reduced in size. To facilitate this size reduction, the sizes of the constituent features, such as electrical devices and interconnect line widths that form the integrated circuits, are also constantly being decreased.

The continual reduction in feature size places ever greater demands on techniques used to form the features. For example, photolithography is a conventional method of patterning features, such as conductive lines, on a substrate. The concept of pitch may be used to describe the size of these features. Pitch is defined as the distance between identical points in two neighboring features. These features are conventionally defined by spacings between adjacent features, which may be filled by a material, such as an insulator. As a result, pitch may be viewed as the sum of the width of a feature and of the width of the space separating that feature from a neighboring feature, or the distance between one edge of a feature and the corresponding same edge of the next adjacent feature. However, due to factors such as optics and light or radiation wavelength, photolithography techniques have a minimum pitch below which the particular photolithographic technique cannot reliably form features. Thus, the minimum pitch of a photolithographic technique may limit feature size reduction.

Pitch doubling, or pitch multiplication, techniques have been proposed for extending the capabilities of photolithographic techniques. One example of a method of pitch multiplication is illustrated in FIGS. 1A-1F herein and described in U.S. Pat. No. 5,328,810, issued to Lowrey et al., the entire disclosure of which is incorporated herein by reference. With reference to FIG. 1A, photolithography may first be used to form a pattern of lines 10 in a photoresist material overlying a layer 20 of an expendable material and a substrate 30. As shown in FIG. 1B, the pattern may then be transferred by an etch step (preferably anisotropic) to the layer 20, forming placeholders, or mandrels 40. The photoresist lines 10 may be stripped and the mandrels 40 may be isotropically etched to increase the distance between neighboring mandrels 40, as shown in FIG. 1C. A layer 50 of material may be subsequently deposited over the mandrels 40, as shown in FIG. 1D. Spacers 60, i.e., material extending or originally formed extending from sidewalls of another material, may then be formed on sidewalls of the mandrels 40 by preferentially etching the spacer material from the horizontal surfaces 70 and 80 in a directional spacer etch, as shown in FIG. 1E. The remaining mandrels 40 may then be removed, leaving behind the freestanding spacers 60, as shown in FIG. 1F. The spacers 60 act as an etch mask for patterning underlying layers, as shown in FIG. 1F. Thus, where a given pitch formerly included a pattern defining one feature and one space, the same width now includes two features and two spaces. As a result, the smallest feature size possible with a photolithographic technique is effectively decreased.

However, conventional pitch doubling processes are limited in that they cannot be reliably used to pitch double asymmetric features, for example, in a DRAM array where symmetry is broken by the removal of the passing wordline over the field region. Problems arise at an array gate patterning level since three features need to be defined on a pitch: two wordlines and a grounded gate over field. The grounded gate over field balances the pattern density as well as ensures that a linear self-aligned contact etch may be performed to form cavities for conducting plugs to the storage and bit contact active regions. Conventional pitch doubling is not effective in this instance because the pitch-doubled feature on every other patterned form does not define the correct gap for the wordline versus wordline and grounded gate. Accordingly, there exists a continuing need in the art for methods of pitch doubling asymmetric features and semiconductor structures including such sub-lithographic features.

DETAILED DESCRIPTION

Figure 1A:
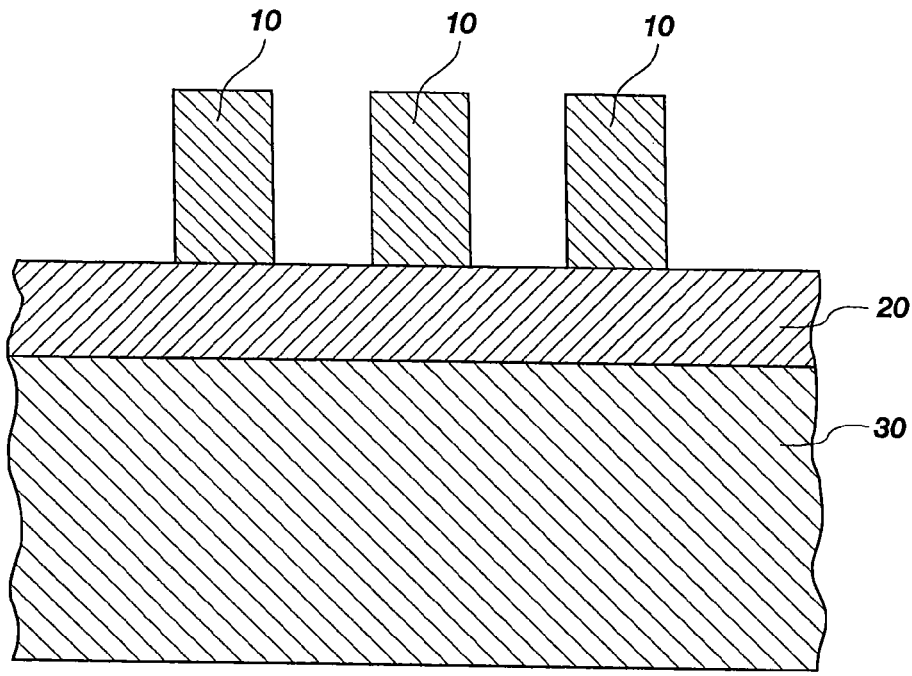
FIGS. 1A-1F are schematic, cross-sectional views of mask lines formed in accordance with conventional pitch doubling methods.
Figure 1B:
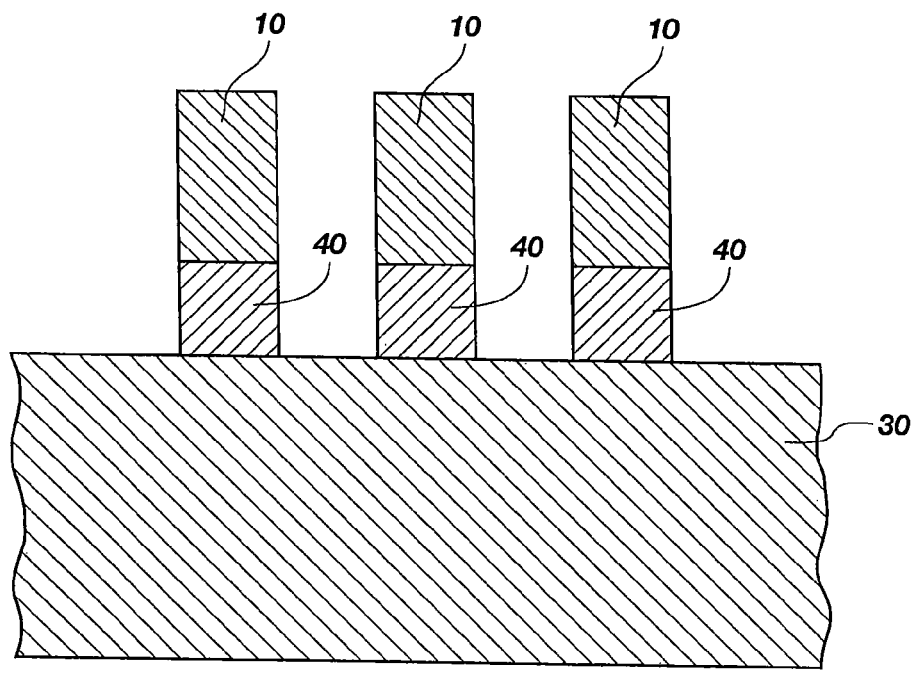
Figure 1C:
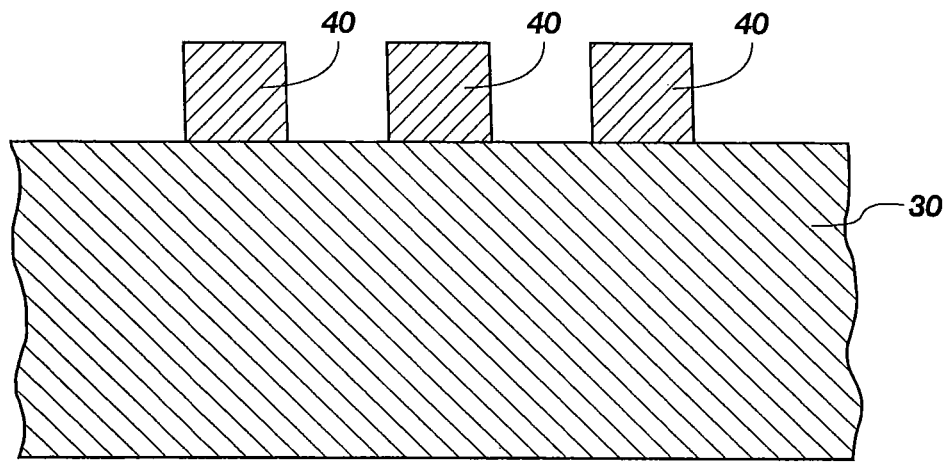
Figure 1D:
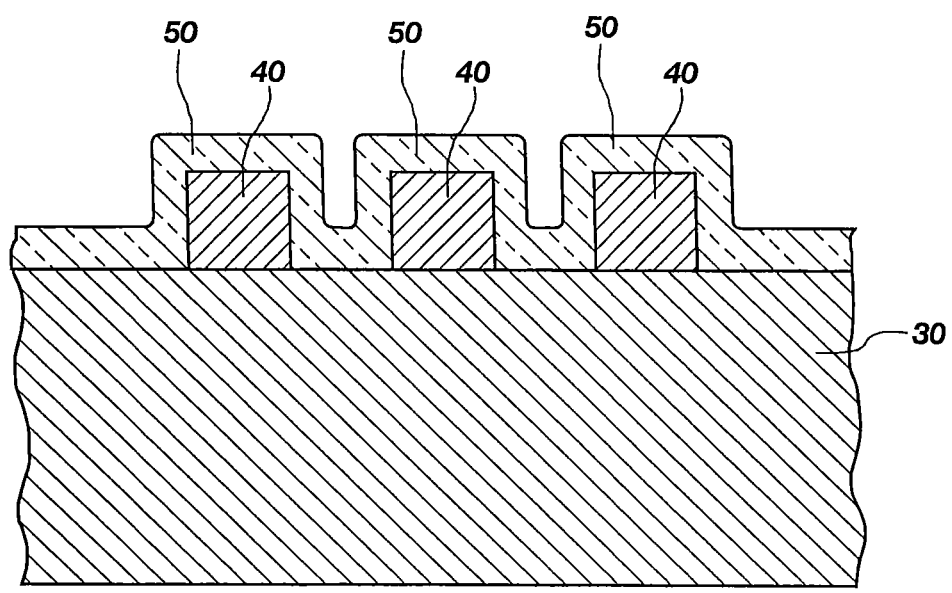
Figure 1E:
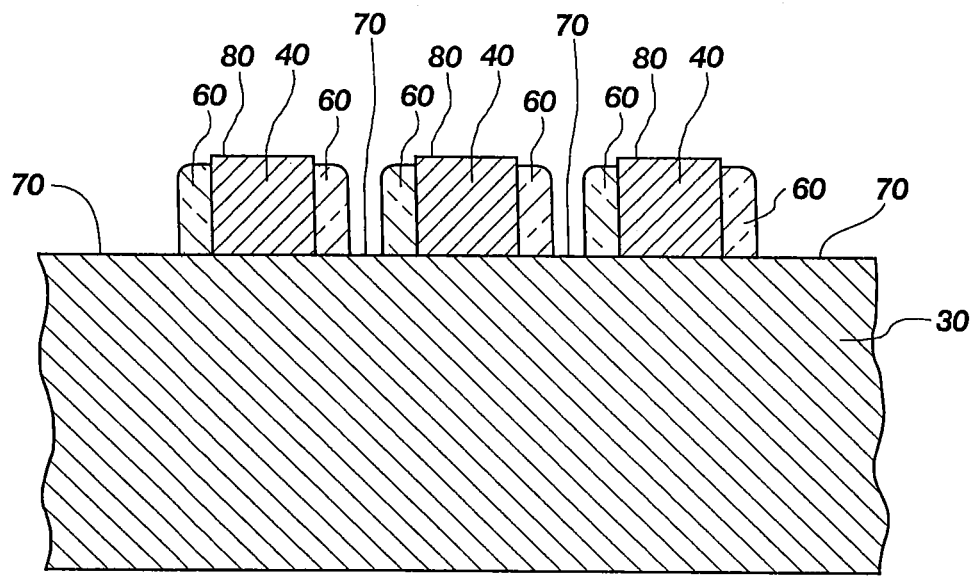
Figure 1F:
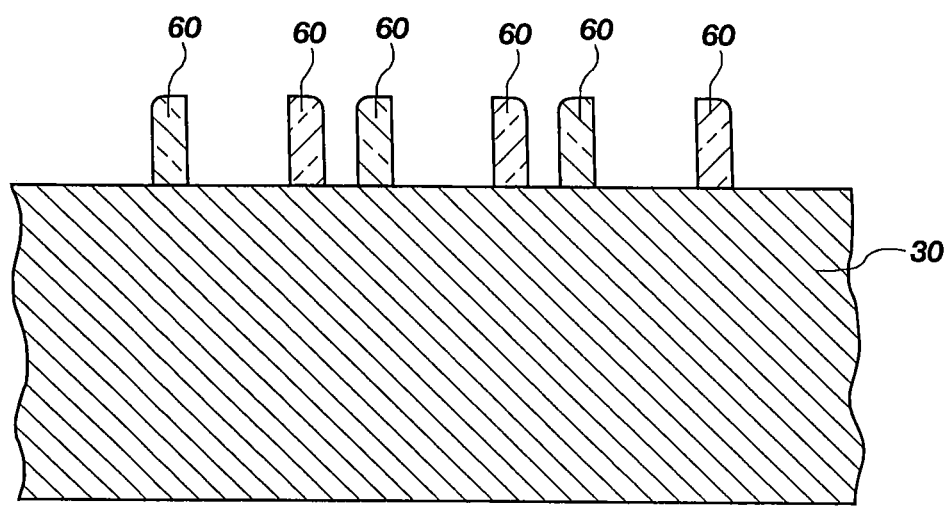

The following description provides illustrative examples of embodiments of devices and methods of the invention with reference to the drawings. Such description is for illustrative purposes only and is nonlimiting to the scope of the invention. The drawings presented herein are not necessarily drawn to scale and are not actual views of a particular semiconductor structure or fabrication process thereof, but are merely idealized representations that are employed to describe the embodiments of the invention. As understood by a person of ordinary skill in the art, other embodiments of devices and methods may be implemented in accordance with the invention.

Semiconductor structures including at least one asymmetric, sub-lithographic feature are disclosed, as are methods of forming such semiconductor structures. Pitch doubling processes may be used to form isolated active areas on a substrate. The asymmetrical features may disrupt the symmetry between lines and spaces on the substrate. As described in detail herein and as illustrated in FIGS. 3-10B, masking materials may be formed over the substrate and patterned in a first direction on the substrate to form an active area pattern. An active area mask may be formed and patterned in a substantially perpendicular direction on the substrate and removed after formation of spacers adjacent thereto. The spacers may function as a mask during subsequent etching so that first trenches are formed between the spacers to isolate active areas on the substrate.

Subsequently, recessed access device (RAD) trenches may be formed on the substrate. As described in detail herein and as illustrated in FIGS. 11A-15, multiple mask materials may be formed on the isolated active areas and patterned. Spacers may be formed adjacent to the mask materials and, after removal of the spacers, the mask materials may function as masks during subsequent etching to form the sub-lithographic trenches. By way of non-limiting example, the trenches may be RAD trenches, FIN trenches, double FIN trenches, or wordlines of a memory array.

Conductive lines and grounded gates of a memory array may then be formed on the substrate. As described in detail herein and as illustrated in FIGS. 16A-20, alternating mask materials and spacers may be formed above the trenches and patterned. The mask materials may be removed and the spacers may function as masks during subsequent etching to form connections to the trenches.

The following description provides specific details, such as material types, etch chemistries, and processing conditions, in order to provide a thorough description of embodiments of the invention. However, a person of ordinary skill in the art will understand and appreciate that these and other embodiments of the invention may be practiced without employing these specific details. Indeed, embodiments of the invention may be practiced in conjunction with conventional fabrication techniques and etching techniques employed in the industry, which, therefore, are not described in detail herein. In addition, the description provided below does not form a complete process flow for manufacturing a semiconductor device. The semiconductor structures described herein do not form a complete semiconductor device. Only those process acts and semiconductor structure structures necessary to understand embodiments of the present invention are described in detail below. Additional acts to form the complete semiconductor device from the semiconductor structures may be performed by conventional fabrication techniques, which are, therefore, not described herein.

The methods described herein may be used to form semiconductor structures of memory devices, such as dynamic random access memory (DRAM), including RAD features, FinFETs, saddle FETs, nanowires, three-dimensional transistors, as well as other three-dimensional semiconductor device features. The memory device or other semiconductor device incorporating such structures may be used in wireless devices, personal computers, or other electronic devices, without limitation. By way of nonlimiting example, the methods herein describe fabricating semiconductor structures of memory devices, such as a DRAM memory device or a RAD memory device. While the methods herein describe fabricating semiconductor structures of memory devices, the methods may also be used in other situations where pitch doubling of asymmetric features is desired. In addition, while the methods described herein are illustrated in reference to a $6F^2$ DRAM device configuration or layout, the methods may be used to form DRAM devices or other semiconductor devices having other layouts, such as for example, $4F^2$ or $8F^2$ layouts, as long as the isolation regions are substantially parallel to locations where transistor gates will ultimately be formed.

Figure 2:
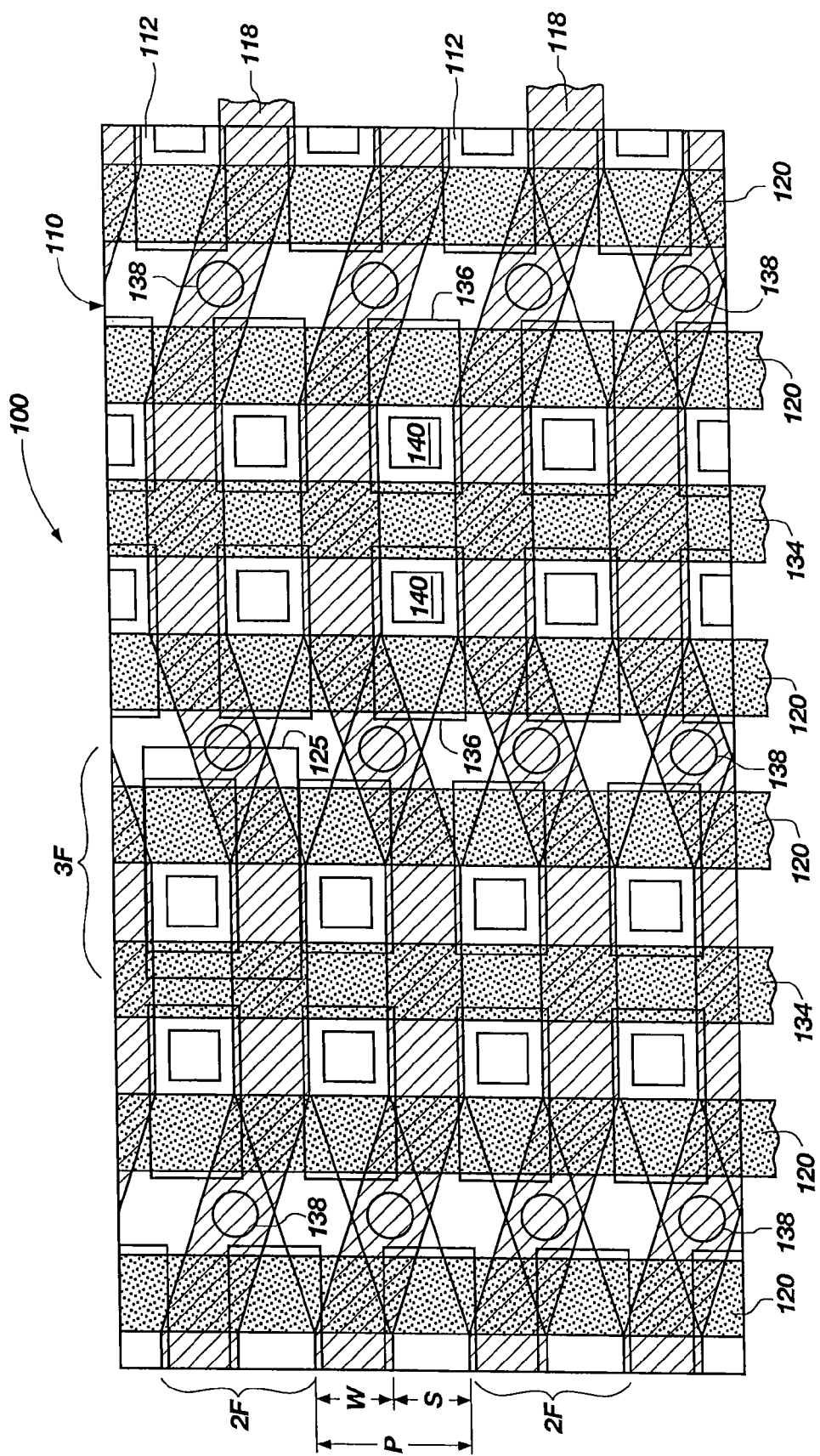
FIG. 2 is a simplified plan view of a circuit layout for one configuration of a $6F^2$ memory array.

Embodiments of the invention may include pitch-doubling features to form an active area, trenches in gates and/or connections to gates of a $6F^2$ memory array. FIG. 2 shows a simplified view of a portion of a circuit layout for a $6F^2$ memory array, which is referred to herein as memory array 100 including a substrate 110. A plurality of continuous active areas 112 may be formed relative to substrate 110. For purposes of clarity, each illustrated continuous active area 112 has been shown to extend outside the boundary of substrate 110. Continuous active areas 112 are conventionally non-linear, following a serpentine path across the memory array 100 in a substantially horizontal direction. A plurality of buried bit lines 118 are shown as hatched areas extending generally horizontally across memory array 100. Each bitline 118 also follows a serpentine path across memory array 100, with the serpentine weave of the bitlines 118 being in the opposite direction relative to the weave of the continuous active areas 112.

A plurality of conductive lines 120, 134 may be formed over substrate 110 relative to the active areas 112. In FIG. 2, six of the conductive lines are designated 120 while two are designated 134. A pair of conductive lines 120 may be formed on either side of conductive line 134. Conductive lines 120, 134 run substantially orthogonally relative to the active areas 112.

Individual areas which are consumed by single memory cells in accordance with the depicted memory array are illustrated by a dashed outline designated numeral 125. Such area can be considered or described as relative to a dimension "F," which is a minimum feature size. In the illustrated example, F equals one-half of the "minimum pitch" of the memory array. The term "pitch" as used herein is intended to be used in its conventional usage, and (as previously noted) may be defined as the distance between one edge of a device or feature and the corresponding same edge of the next adjacent device or feature. Accordingly, with respect to the memory cell 125, the term "minimum pitch" is about equal to the smallest distance of a line width (such as conductive lines 120, 134) plus the width of a space immediately adjacent the conductive line 120 on one side of the conductive line 120 between the conductive line 120 and the next adjacent conductive line 120 in a repeated pattern within the memory cell 125. As shown, a single memory cell 125 is about 3F wide by about 2F deep, thus providing a consumed area for a single memory cell 125 of about $6F^2$.

In examples of implementations of the memory array 100, such as that depicted in FIG. 2, selected individual conductive lines may provide electrical isolation relative to adjacent memory cells 125. For instance, as depicted, conductive lines 120 serve as wordlines relative to individual memory cells 125. Electrical isolation between adjacent pairs of memory cells 125 is provided by intervening conductive line 134, which, in operation, may be connected with ground or a suitable negative voltage. Alternatively, field oxide isolation techniques may be utilized.

The memory array 100 depicted in FIG. 2 may additionally include capacitor containers 136 and bitline contacts 138. Capacitors may conventionally be formed within capacitor containers 136 and may be coupled to active areas via storage node contacts 140. In particular aspects, the storage node contacts 140 may include a conductive material which extends to a node portion of an active area.

It is noted with reference to FIG. 2 that the capacitor containers 136 depicted have a pitch substantially equivalent to the pitch of the memory cell 125. In other words, the width of each capacitor container 136 (in a vertical direction on the page) plus the width of the space between immediately adjacent capacitor containers (in a vertical direction on the page) is substantially equivalent to the pattern pitch "P," where P is the sum of the line width "W" plus the width of the space "S" immediately adjacent the line, as depicted in FIG. 2.

To form the memory array 100 depicted in FIG. 2, masking materials are used in combination with a substantially vertical etch of materials overlying the substrate 110 to form self-aligned features in or on the substrate 110. As used herein "self-aligned" means and includes using a single photomask to form an initial pattern upon which other features are based. As such, features formed on the substrate 110 are aligned without utilizing additional masking and photolithography acts. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide.

Figure 3:
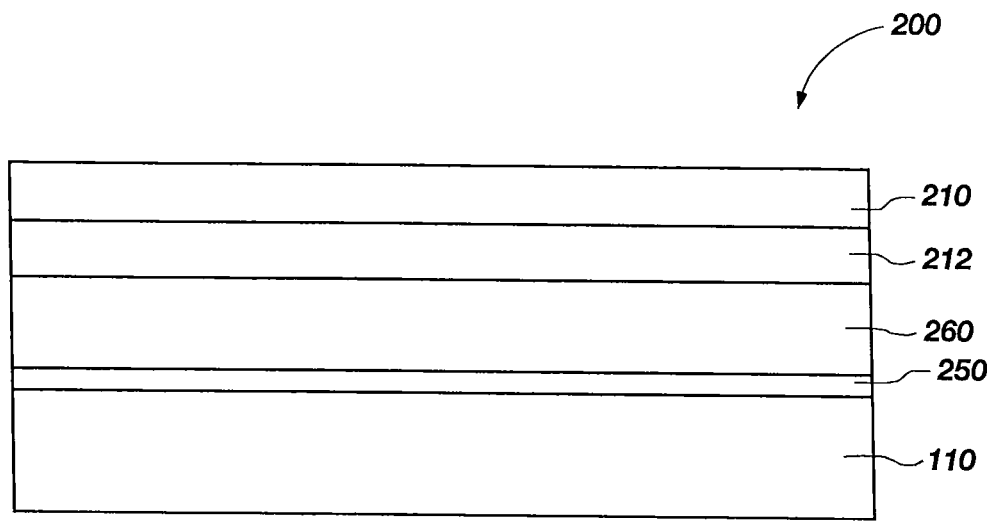
FIG. 3 is a cross-sectional view of an embodiment of a work piece at a preliminary stage in processing.

FIGS. 3-10B depict an embodiment of a semiconductor structure 200 at various stages of fabrication using pitch doubling to form an isolated active area on the substrate 110. FIG. 3 depicts the semiconductor structure 200 with various materials which may include insulative material 250, an optional etch-stop material 260, first expendable material 212 and selectively definable material 210 on the substrate 110. Collectively, insulative material 250, the optional etch-stop material 260, expendable material 212 and selectively definable material 210 may be referred to as "masking materials." While the materials are illustrated on the substrate 110 in the form of layers, the materials may also be formed in other configurations. The masking materials described herein may be formed by any suitable deposition technique including, but not limited to, spin coating, blanket coating, chemical vapor deposition ("CVD"), atomic layer deposition ("ALD"), plasma-enhanced ALD, or physical vapor deposition ("PVD"). Depending on the specific material to be used, the technique for forming the masking materials may be selected by a person of ordinary skill in the art.

By way of nonlimiting example, the substrate 110 is formed from silicon, such as a silicon semiconductor substrate. Insulative material 250 may be deposited on the substrate 110. The insulative material 250 may be a silicon oxide, such as tetraethylorthosilicate ("TEOS"), silicon dioxide ("$SiO_2$"), or a high density plasma ("HDP") oxide. The insulative material 250 may be thermally grown on the substrate 110. By way of non-limiting example, the insulative material 250 may have a thickness within a range of from approximately 25 Å to approximately 75 Å. In one embodiment, the insulative material 250 is $SiO_2$ and is thermally grown on the substrate 110.

The etch-stop material 260, if present, may be deposited on the insulative material 250. The etch-stop material 260 may function as an effective etch stop during chemical mechanical planarization ("CMP") of overlying materials. The etch-stop material 260 may be a nitride material. In one embodiment, the etch-stop material 260 is a nitride including, but not limited to, silicon nitride ("$Si_3N_4$").

The expendable material 212 may be formed from a patternable material that is selectively etchable relative to the substrate 110 and to other exposed underlying materials of the semiconductor structure 200. The material of the expendable material 212 may be a carbon-containing material, a dielectric antireflective coating ("DARC"), or a bottom antireflective coating ("BARC") material. By way of non-limiting example, the expendable material 212 may be amorphous carbon, transparent carbon, tetraethylorthosilicate ("TEOS"), silicon nitride ("$Si_3N_4$"), silicon carbide ("SiC"), silicon or a dielectric antireflective coating (DARC), such as a silicon-rich oxynitride ("$SiO_3N_4$"), silicon oxide ($SiO_2$), or combinations thereof. By way of non-limiting example, the expendable material 212 may be deposited at a thickness within a range of from approximately 800 Å to approximately 2500 Å, such as at approximately 2000 Å. The materials overlying the substrate 110 may be selected based upon consideration of the chemistry and process conditions for the various pattern forming and pattern transferring steps discussed herein. Because the materials between the expendable material 212 and the substrate 110 function to transfer a pattern derived from the expendable material 212 to the substrate 110, these materials are selected so that they may be selectively etched relative to other exposed materials. As used herein, a material is "selectively etchable" when the material exhibits an etch rate of at least approximately two times greater than that of the other material exposed to the same etch chemistry. Ideally, such a material has an etch rate of at least approximately ten times greater than that of another material exposed to the same etch chemistry. As such, it will be understood that the expendable material 212, insulative material 250 and etch-stop material 260 may be any combination of materials that enable selective removal as described herein.

The selectively definable material 210 may be definable by a lithographic process, e.g., formed of a photoresist material, including any photoresist material known in the art. Since photoresist materials and photolithographic techniques are well known in the art, selecting, depositing, patterning, and developing the photoresist material to produce a desired pattern are not discussed in detail herein.

Figure 4:
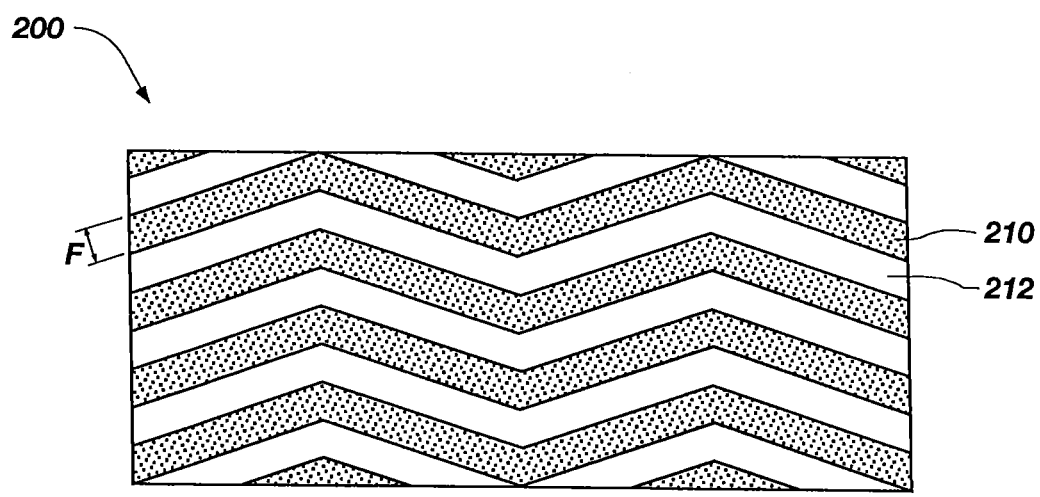
FIG. 4 is a plan view of an embodiment of a work piece at a stage in processing step subsequent to that illustrated in FIG. 3.

FIG. 4 shows an embodiment of the semiconductor structure 200 having a patterned, selectively definable material 210 thereon. The pattern in the selectively definable material 210 may include spaces and lines having substantially equal widths. The spaces may correspond to removed portions of the selectively definable material 210 while the lines correspond to remaining portions of the selectively definable material 210. The width of the lines may be a minimum feature size ("F") printable by the photolithography technique used to form the pattern. Alternatively, the spaces and lines may be printed at a feature size greater than F. By way of non-limiting example, F may range from approximately 40 nm to approximately 70 nm, such as approximately 44 nm. While FIG. 4 illustrates a 1F weave pattern, it will be appreciated that other layouts may be used.

The pitch between adjacent lines in FIG. 4 is equal to the sum of the width of the line of selectively definable material 210 and the width of the neighboring space. To minimize the critical dimensions of features formed using this pattern of lines and spaces, the pitch may be at or near the limits of the photolithographic technique used to pattern the selectively definable material 210. For example, the pitch of the lines may be between about 80 nm and about 140 nm. Thus, the pitch may be at the minimum pitch of the photolithographic technique and the spacer pattern discussed below may advantageously have a pitch below the minimum pitch of the photolithographic technique. Alternatively, because the margin of error for position and feature size typically increases as the limits of a photolithographic technique are approached, the lines may be formed having larger feature sizes to minimize errors in the positions and sizes of the lines and may be subsequently trimmed to a smaller size.

Figure 5A:
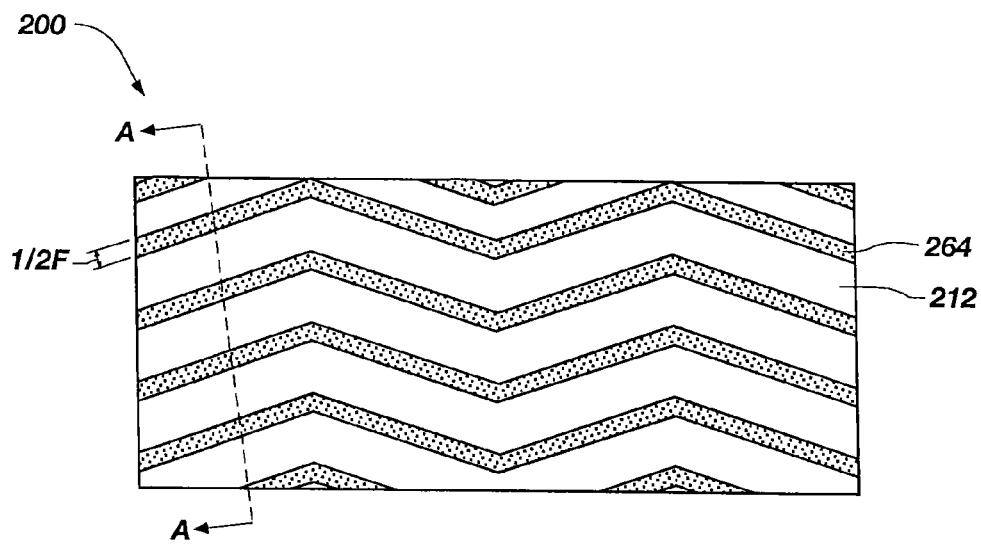
FIG. 5A is a top view of an embodiment of a semiconductor structure and FIG. 5B is a cross-sectional view of an intermediate semiconductor device.

Referring to FIG. 5A, the pattern in the selectively definable material 210 may be transferred into the expendable material 212 forming an expendable structure 264 over etch-stop material 260, if present. After transferring the pattern to the expendable material 212, the selectively definable material 210 may be removed by conventional techniques. In one embodiment, the expendable structure 264 may be an expendable line. The pattern formed in the selectively definable material 210 may be etched into the expendable material 212 using a conventional etch process, such as a conventional dry etch process, a conventional wet etch process, or combinations thereof. By way of non-limiting example, a dry etch chemistry may be used to etch the expendable material 212, producing the expendable structure 264 having substantially vertical sidewalls 265. As used herein, the term "substantially vertical sidewalls" means and includes sidewalls having a slope angle of less than approximately 5° to the vertical. In one embodiment, the width of the expendable structures 264 may be F.

Figure 5B:
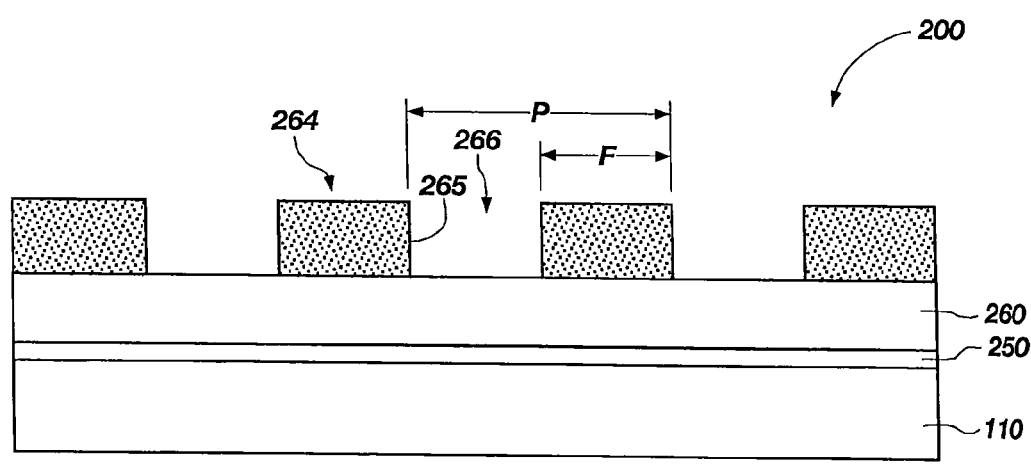
Figure 5C:
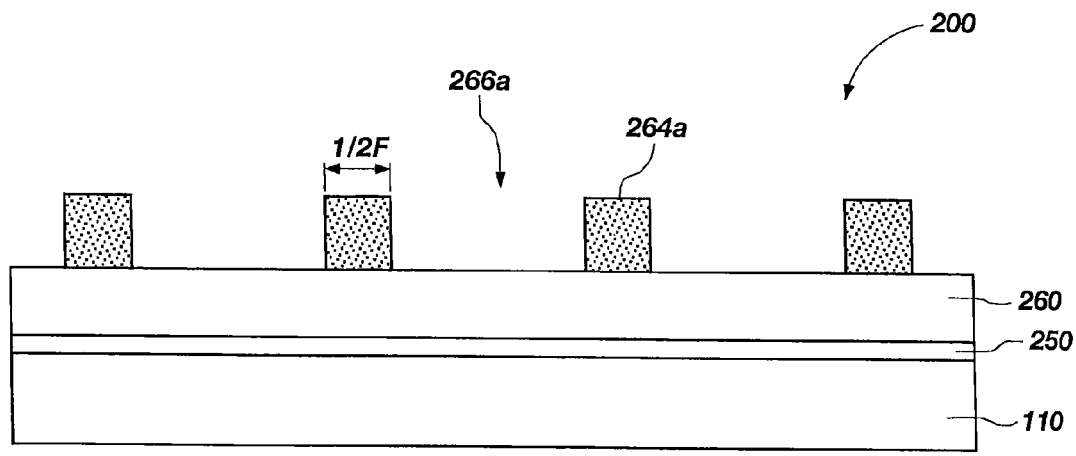
FIG. 5C is a cross-sectional view of an embodiment of a semiconductor structure at a stage in processing subsequent to that illustrated in FIG. 5B.

After removing the selectively definable material 210, the expendable structure 264 may be trimmed. In an embodiment of the invention, the expendable structure 264 may be trimmed from F to ½F. As shown in FIGS. 5B and 5C, the spaces 266 between each expendable structure 264 may be widened by etching the expendable structures 264, to form modified spaces 266a and modified structures 264a (FIG. 5C). The expendable structure 264 may be etched using an isotropic etch to "shrink" those features. Suitable etches include etches using an oxygen-containing plasma, e.g., a $SO_2/O_2/N_2/Ar$, $Cl_2/O_2/He$ or $HBr/O_2/N_2$ plasma. The extent of the etch may be selected so that the widths of the modified structures 264a are substantially equal to the desired spacing between later-formed, spacers 268, as will be appreciated from the discussion herein. For example, the width of the expendable structure 264 may be reduced from about 70 nm to about 35 nm. Advantageously, the width-reducing etch enables the modified structures 264a to be narrower than would otherwise be possible using the photolithographic technique used to pattern the selectively definable material 210. In addition, the etch may smooth the edges of the modified structures 264a, thus improving the uniformity of those lines.

Figure 6A:
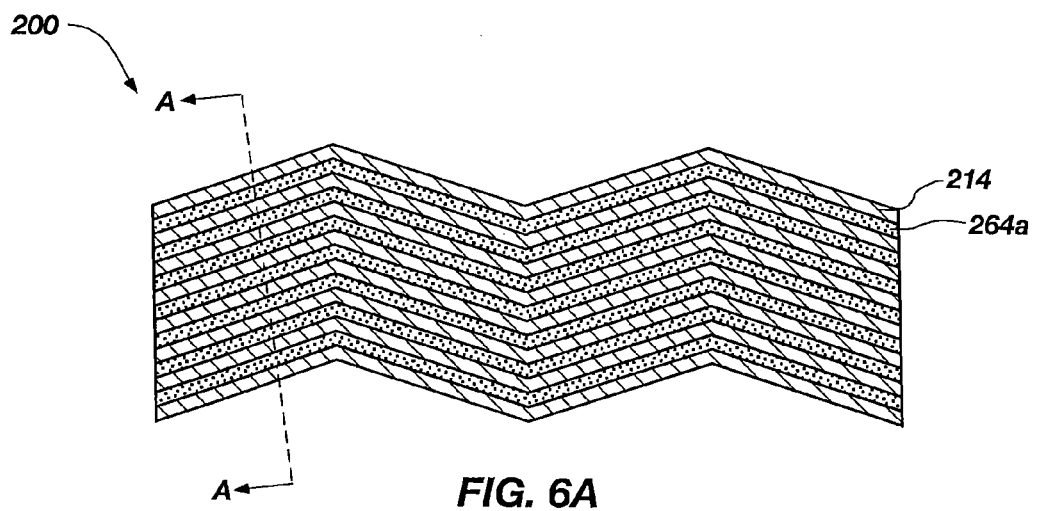
FIG. 6A is a top view of an embodiment of a semiconductor structure and FIG. 6B is a cross-sectional view of the semiconductor structure of FIG. 6A taken along the dashed line labeled A.
Figure 6B:
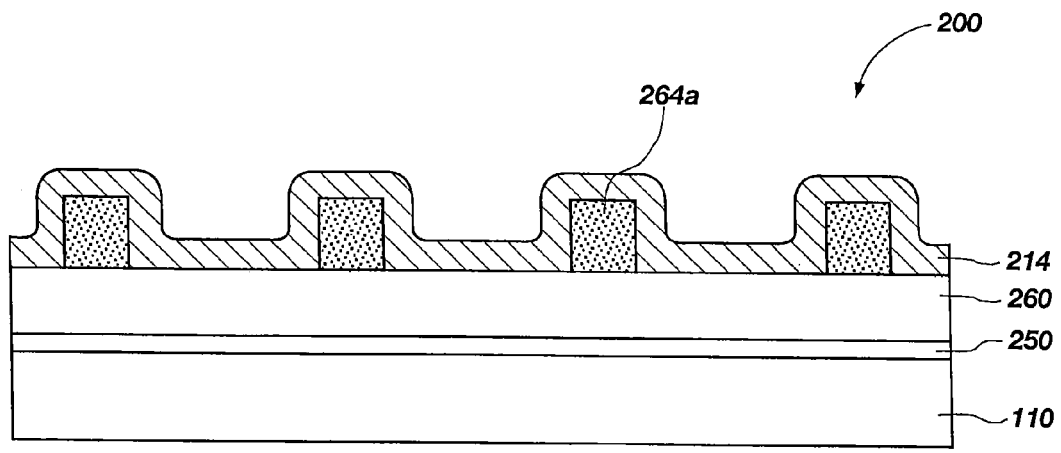

Spacer material 214 may be formed over the exposed surfaces of the semiconductor structure 200, as shown in FIGS. 6A and 6B. The spacer material 214 may be conformally deposited over modified structure 264a by conventional techniques, such as by ALD. By conformally depositing the spacer material 214, the thickness of the spacer material 214 may remain substantially uniform regardless of the geometry or topography of underlying features, such as the modified structures 264a. The modified structures 264a may be selectively etchable relative to the spacer material 214. As an example only, spacer material 214 may be formed from polysilicon, silicon nitride $Si_3N_4$ or silicon oxide ("$SiO_x$").

Figure 6C:
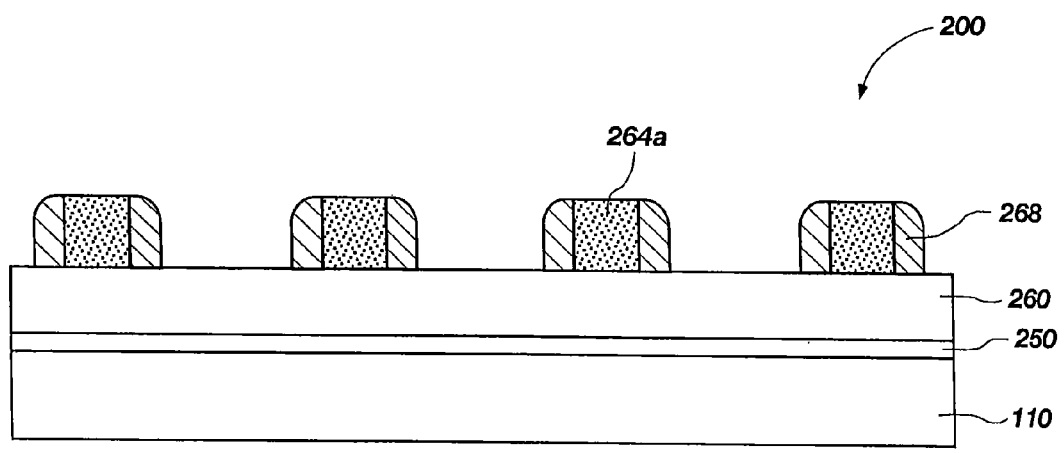
FIG. 6C is a cross-sectional view of an embodiment of a semiconductor structure at a stage in processing step subsequent to that illustrated in FIG. 6B.

Referring to FIG. 6C, the spacer material 214 may be anisotropically etched, removing the spacer material 214 from substantially horizontal surfaces while leaving the spacer material 214 on substantially vertical surfaces. As such, the substantially horizontal surfaces of the modified structure 264a and the substantially horizontal surfaces of the underlying portions of the semiconductor structure 200 may be exposed. If the spacer material 214 is formed from $SiO_x$, the anisotropic etch may be a plasma etch, such as a $CF_4$-containing plasma, a $C_2F_6$-containing plasma, a $C_4F_8$-containing plasma, a $CHF_3$-containing plasma, a $CH_2F_2$-containing plasma, or mixtures thereof. If the spacer material 214 is formed from silicon nitride, the anisotropic etch may be a $CHF_3/O_2/He$ plasma or a $C_4F_8/CO/Ar$ plasma. The spacers 268 produced by the etch may be present on substantially vertical sidewalls of the etched portions of the modified structures 264a. The width of the spacers 268 may correspond to the desired width of features, such as trenches, ultimately to be formed on the semiconductor structure 200. In one embodiment, the width of the spacers 268 may be ½F. As discussed in further detail herein, first trenches 222 (shown in FIGS. 10A and 10B) having a sub-lithographic width may be formed in the substrate 110 between the area defined by spacers 286. As used herein "sub-lithographic" means less than about 70 nm, such as about 44 nm. In one embodiment, the first trenches 222 (shown in FIGS. 10A and 10B) have a width of approximately ½F.

Figure 7A:
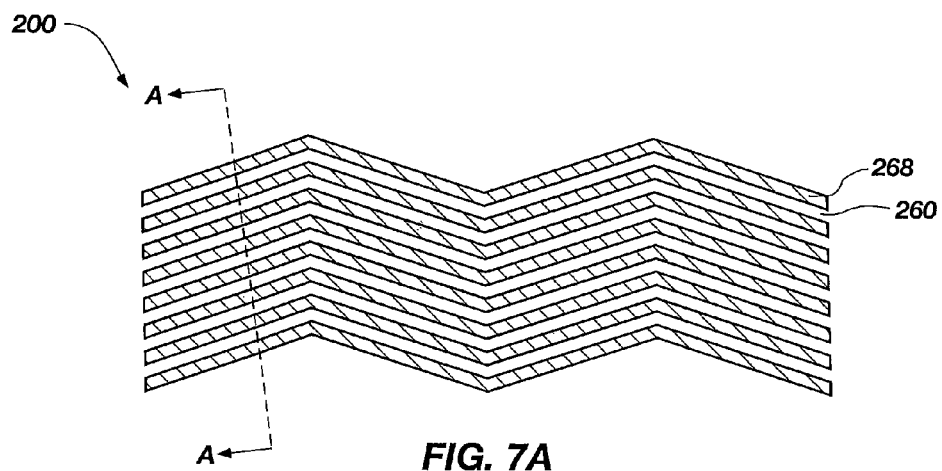
FIG. 7A is a top view of an embodiment of a semiconductor structure and FIG. 7B is a cross-sectional view of the semiconductor structure of FIG. 7A taken along the dashed line labeled A.
Figure 7B:
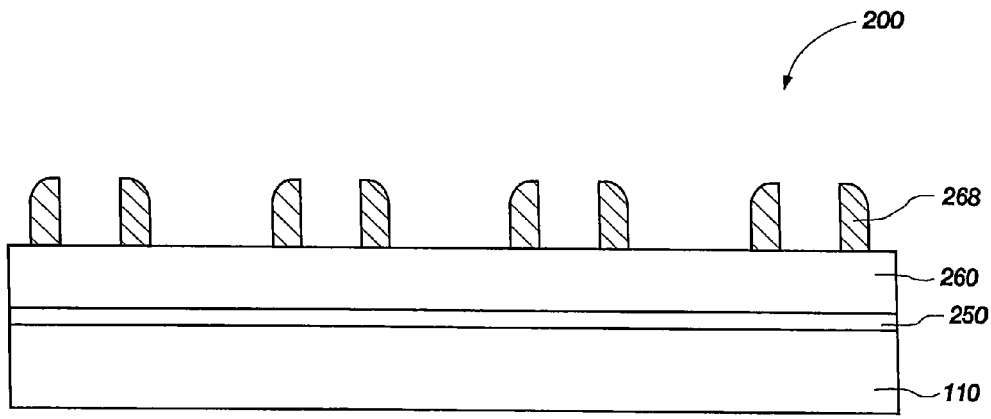

The modified structure 264a may then be removed by conventional methods, leaving behind the spacers 268, as shown in FIGS. 7A and 7B. For instance, if an amorphous carbon is used as the expendable material 212 from which the modified structure 264a is formed, the amorphous carbon may be removed using an oxygen-based plasma, such as an $O_2/Cl_2$ plasma, an $O_2/HBr$ plasma, or an $O_2/SO_2/N_2$ plasma.

Figure 8:
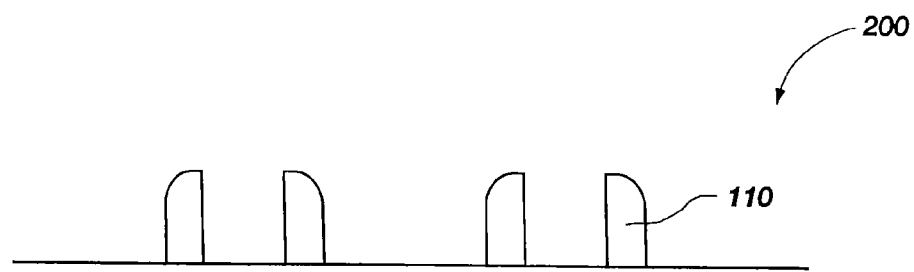
FIG. 8 is a cross-sectional view of an embodiment of a semiconductor structure at a stage in processing step subsequent to that illustrated in FIG. 7B.

Next, a dry etch chemistry may be used to transfer the pattern of the spacers 268 into the materials underlying the modified structure 264a. Alternatively, multiple dry etch chemistries may be used to separately etch each of the materials underlying the modified structures 264a. For example, a first etch may transfer the pattern of the spacers 268 into the underlying etch-stop material 260, if present, and a second etch may transfer the pattern of the spacers 268 into the substrate 110, as shown in FIG. 8, forming trenches therein. Etch chemistries suitable for etching these materials are known in the art and, therefore, are not described in detail herein.

Figure 9:
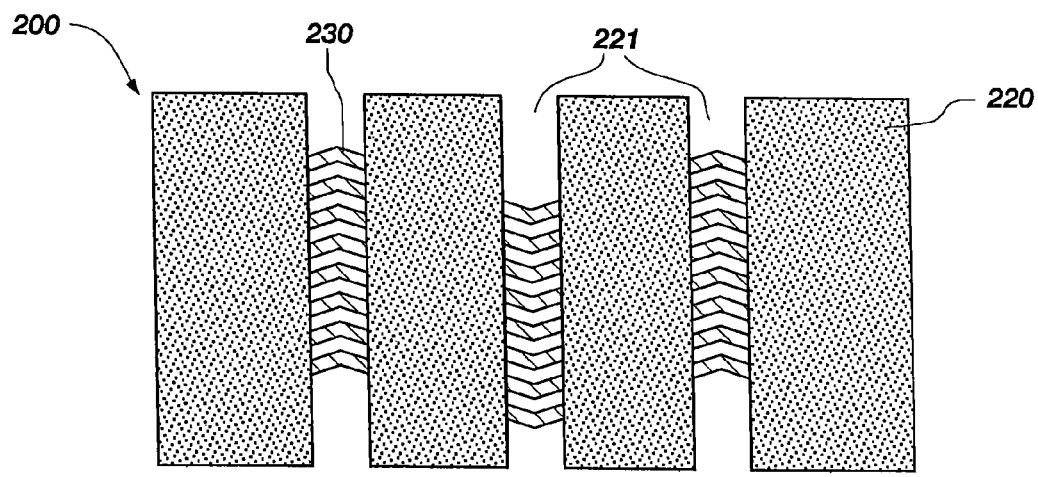
FIG. 9 is a top view of an embodiment of a semiconductor structure at a stage in processing subsequent to that illustrated in FIG. 8.

As shown in FIG. 9, active areas 230 of the semiconductor structure 200 may be patterned with an active area mask that includes openings 221 to isolate active areas 230 with a relaxed pitch and feature size. The active area 230 is illustrated as extending in a substantially horizontal direction across the substrate 110 while the openings 221 of the active area mask 220 are illustrated as extending substantially perpendicular to the active area 230. The active area mask including the openings 221 may be thought to extend in a substantially vertical direction across the substrate 110. The active area mask 220 may be formed from carbon, such as amorphous carbon or transparent carbon. To reduce the dimensions of the openings 221 in the active area mask, sacrificial spacer material (not shown) may, optionally, be deposited on sidewalls of the openings 221 and trimmed to expose the active area mask 220 such that the active area mask 220 openings 221 are flanked by spacers. The pattern of openings 221 may be transferred to the substrate 110 to isolate the active areas 230. The pattern of openings 221 in the active area mask 220 may be transferred by conventional etching methods or by methods described herein. In an embodiment of the invention, a 70 nm pitch active area 230 may be formed on the semiconductor structure 200.

Figure 10A:
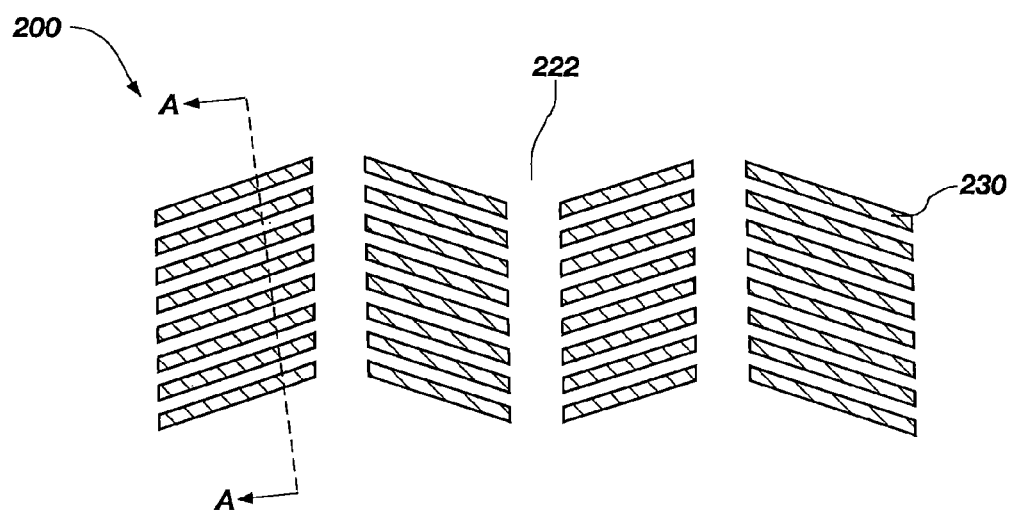
FIG. 10A is a top view of an embodiment of a semiconductor structure and FIG. 10B is a cross-sectional view of the semiconductor structure of FIG. 10A taken along the dashed line labeled A.
Figure 10B:
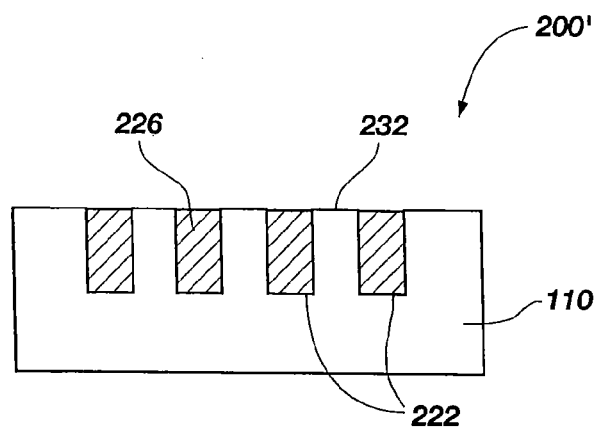

As shown in FIGS. 10A and 10B, the active area mask 220 may be removed and the substrate 110 may be etched in the location previously masked by the active area mask 220. If the active area mask 220 is flanked by spacers, the active area mask 220 may be removed and the remaining spacers may be used as a mask to etch the substrate 110. The substrate 110 may be etched by ion milling, reactive ion etching, or chemical etching. For instance, if the substrate 110 is formed from silicon, the substrate 110 may be anisotropically etched using $HBr/Cl_2$ or a fluorocarbon plasma etch. To etch a desired depth into the substrate 110 formed from silicon, the etch time may be controlled. For instance, the silicon may be exposed to the appropriate etch chemistry for an amount of time sufficient to achieve the desired depth in the silicon.

After etching, the spacers may be removed by conventional methods, such as wet or dry etching. By way of non-limiting example, if the spacers are formed from polysilicon, the spacers may be etched using a solution of tetramethylammonium hydroxide (TMAH). Alternatively, if the spacers are formed from a nitride, the spacers may be removed using a dry etch chemistry.

Referring to FIG. 10A, first trenches 222 are formed between active areas 230 which may be, for example, active silicon. As shown in FIG. 10B, a first fill material 226 may be blanket deposited over the semiconductor structure 200 and densified, as known in the art. The first fill material 226 may be a silicon dioxide-based material, such as a spin-on-dielectric ("SOD"), silicon dioxide, TEOS, or a high density plasma ("HDP") oxide. The first fill material 226 may be planarized, such as by chemical mechanical polishing ("CMP"), to remove portions of the first fill material 226 extending above silicon pillars 232 of the substrate 110.

The silicon pillars 232 in the active area 230 and first trenches 222 shown in FIGS. 10A and 10B have been pitch doubled in two directions. It will be appreciated that while the pitch is actually halved in the example above, this reduction in pitch is conventionally referred to as pitch "doubling." It will be further understood that embodiments of the invention include pitch doubling in only one direction, for example, either the width of the silicon pillar 232 or the width of the first trenches 222. In an embodiment of the invention, the width of the silicon pillar 232 and/or the width of the first trenches 222 may be sub-lithographic.

Figure 11A:
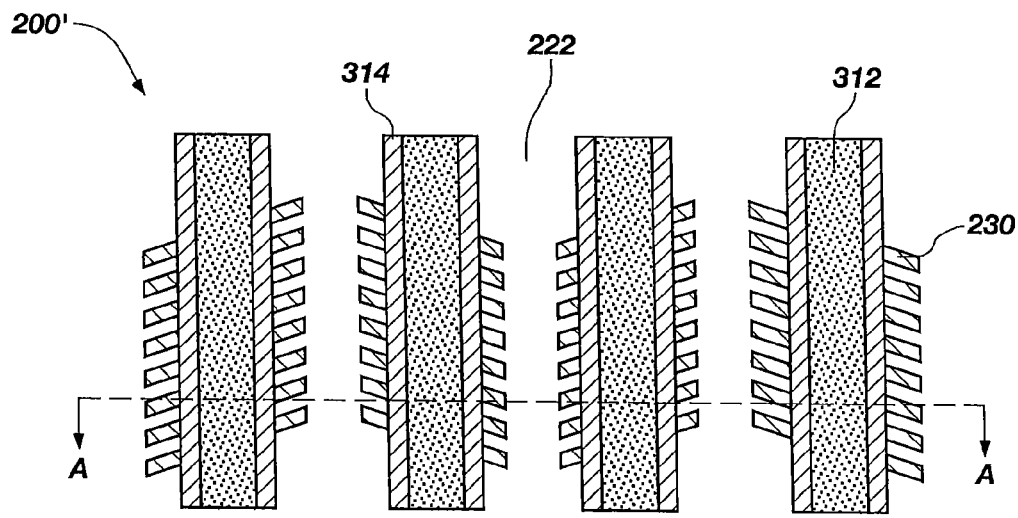
FIG. 11A is a top view of an embodiment of a semiconductor structure and FIG. 11B is a cross-sectional view of the semiconductor structure of FIG. 11A taken along the dashed line labeled A.

The semiconductor structure 200' of FIGS. 10A and 10B may be subjected to further processing. By way of non-limiting example, the semiconductor structure 200' may be subjected to an additional pitch doubling process to form trenches in gates of a memory array, as shown in FIGS. 11A-15. With reference to FIG. 11A, second expendable material 312 may be deposited over the active area 230 and patterned as described herein. The second expendable material 312 may be patterned in a substantially parallel orientation relative to the first trenches 222. The second expendable material 312 may be deposited at F and trimmed to ½F. In an embodiment, the second expendable material 312 may be amorphous carbon and may be patterned using an anisotropic etch, such as an etch using a fluorocarbon plasma, although a wet (isotropic) etch may also be suitable if the second expendable material 312 is thin. Plasma etch chemistries may include, without limitation, $CF_4$, $CFH_3$, $CF_2H_2$, $CF_3H$.

Figure 11B:
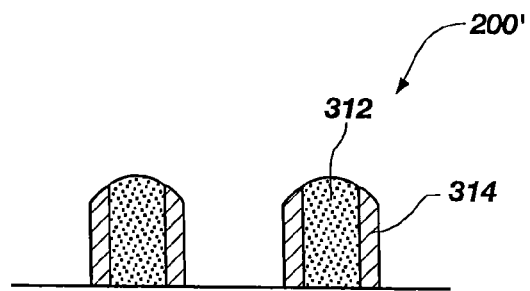

A spacer material 314 may be deposited over the patterned second expendable material 312 and trimmed by conventional methods. The spacer material 314 may be deposited at ½F such that the second expendable material 312 and the spacer material 314 have a combined width of F. The spacer material 314 may be deposited by chemical vapor deposition or atomic layer deposition. The spacer material 314 may be any material capable of being selectively removed relative to the second expendable material 312 and later-formed sacrificial material 313. By way of non-limiting example, the spacer material 314 may include silicon nitrides and silicon oxides. In one embodiment, the spacer material 314 and the second expendable material 312 may be the same material. The spacer material 314 may be anisotropically etched to remove the spacer material 314 from horizontal surfaces of the second expendable material 312 and underlying substrate 110, as shown in FIG. 11B. Such an etch, also known as a spacer etch, may be performed using a fluorocarbon plasma.

Figure 12A:
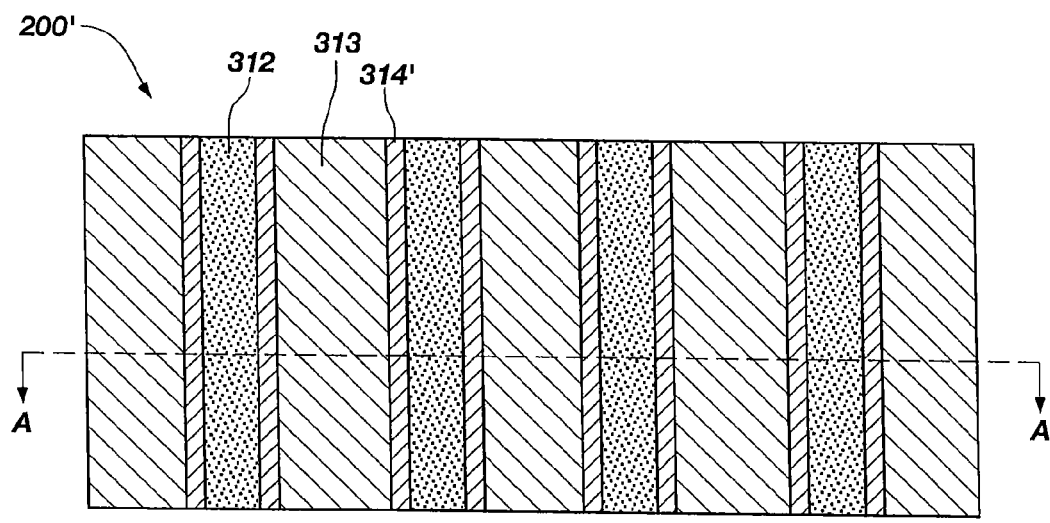
FIG. 12A is a top view of an embodiment of a semiconductor structure at a stage in processing subsequent to that illustrated in FIG. 11B
Figure 12B:
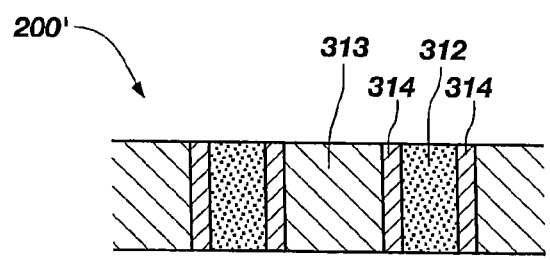
FIG. 12B is a cross-sectional view of the semiconductor structure of FIG. 12A taken along the dashed line labeled A.

Next, sacrificial material 313 may be deposited over the second expendable material 312 and spacer material 314. The sacrificial material 313 may be planarized to expose the second expendable material 312 and spacer material 314, as shown in FIGS. 12A, 12B. The sacrificial material 313 may include the same material as the second expendable material 312, or may be any material that is selectively etched compared to the spacer material 314.

Figure 13:
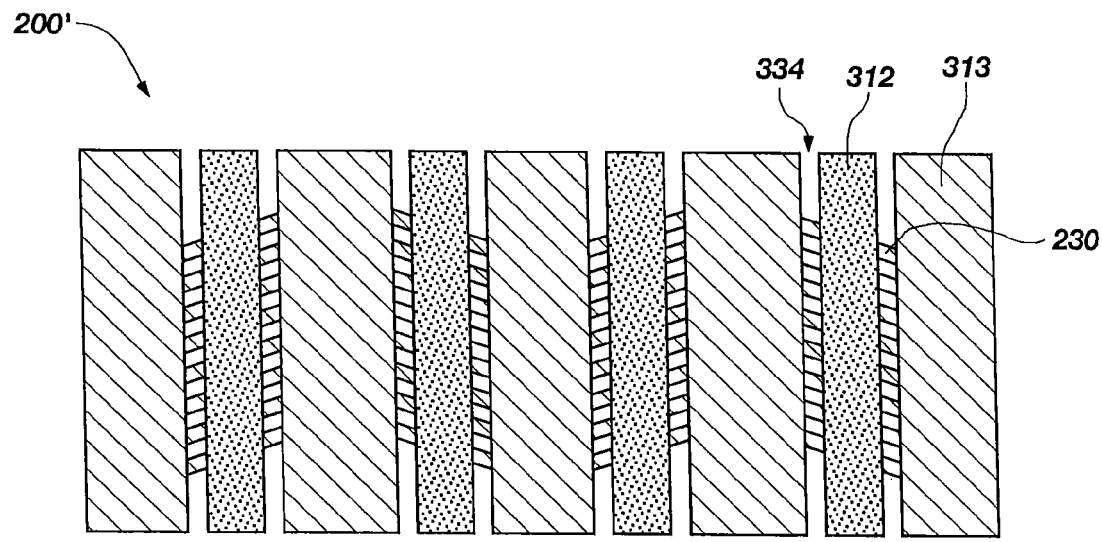
FIG. 13 is a top view of an embodiment of a semiconductor structure at a stage in processing subsequent to that illustrated in FIG. 12B.
Figure 14A:
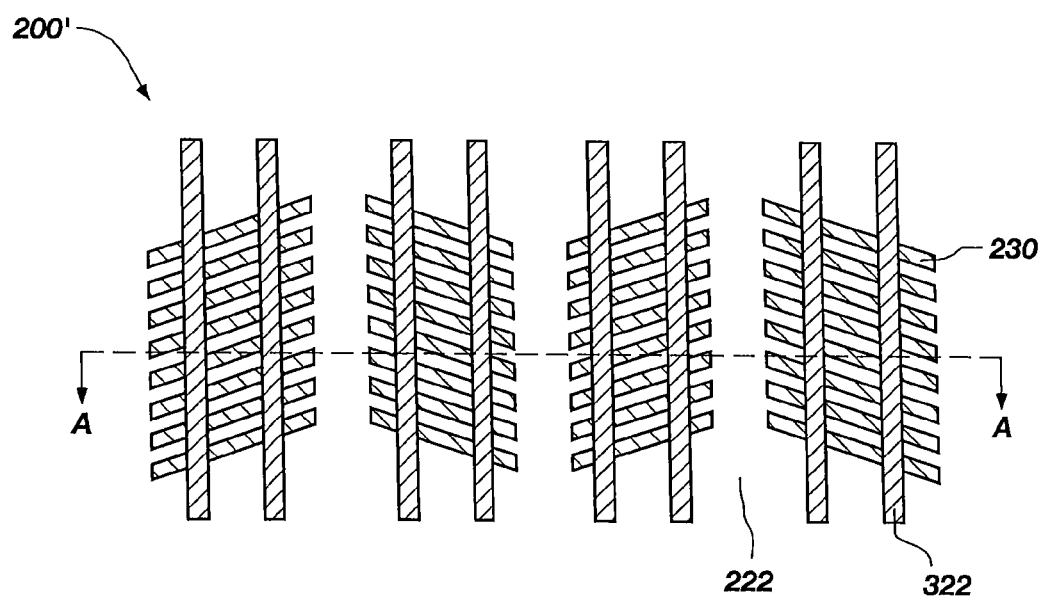
FIG. 14A is a top view of an embodiment of a semiconductor structure and FIG. 14B is a cross-sectional view of the semiconductor structure of FIG. 14A taken along the dashed line labeled A.

As shown in FIG. 13, the spacer material 314 may be selectively etched relative to the second expendable material 312 and the sacrificial material 313 to create a gap 334. The remaining expendable material 312 and sacrificial material 313 may function as a mask during etching of the underlying substrate 110 to form the second trenches 322 in the location of gap 334, as shown in FIG. 14A. The second trenches 322 may have a width of ½F. Due to the spacing of the second expendable material 312 and sacrificial material 313, the second trenches 322 may be positioned asymmetrically on the substrate 110. The substrate 110 may be etched by ion milling, reactive ion etching, or chemical etching For instance, if the substrate is formed from silicon, the substrate may be anisotropically etched using $HBr/Cl_2$ or a fluorocarbon plasma etch. To etch a desired depth into the substrate formed from silicon, the etch time may be controlled. For instance, the silicon may be exposed to the appropriate etch chemistry for an amount of time sufficient to achieve the desired depth in the silicon.

In embodiments of the invention, the second trenches 322 may be recessed access device or "RAD" trenches. As used herein, "RAD trenches" means and includes an opening in a substrate in which a RAD transistor is ultimately formed. One example of a RAD transistor includes a transistor gate (wordline) which is partially formed within a trench in a semiconductor substrate.

Figure 14B:
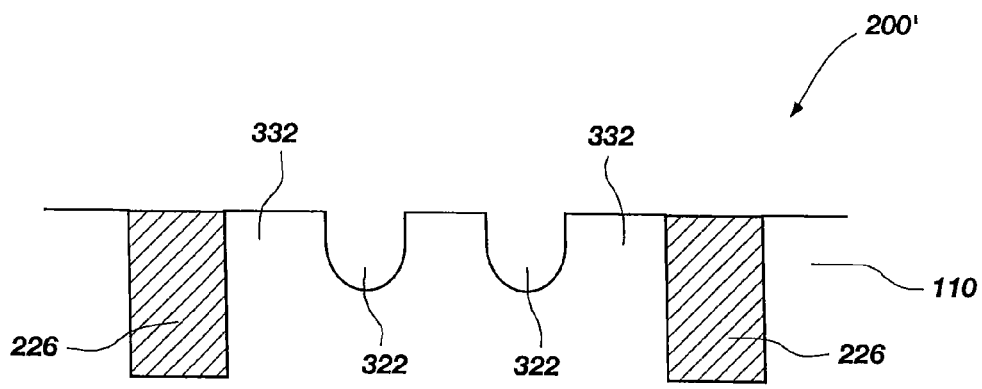

After etching, the second expendable material 312 and the sacrificial material 313 may be removed by conventional methods. The pattern remaining after the second expendable material 312 and the sacrificial material 313 are removed may include silicon pillars 332 (also referred to as "pedestals" or "fins") of the active area 230 and the second trenches 322 (gate trenches) with array active area patterns, as shown in FIG. 14B. Thus, pitch doubling has occurred for the second trenches 322 in the gates. In an embodiment of the present invention, the second trenches 322 have a sub-lithographic width.

It will be understood that the second expendable material 312, spacer material 314 and sacrificial material 313, may be selected such that the spacer material 314 may be selectively removable relative to the second expendable material 312 and sacrificial material 313. Thus, in an embodiment, the second expendable material 312 and sacrificial material 313 may be the same material. Each of the second expendable material 312, sacrificial material 313 and spacer material 314 may be selected from amorphous or transparent carbon, polysilicon, silicon dioxide and silicon nitride such that the spacer material 314 may be selectively removable relative to the second expendable material 312 and sacrificial material 313. The material for the second expendable material 312 and sacrificial material 313 may be selected to withstand the subsequent trench etch chemistry.

Figure 15:
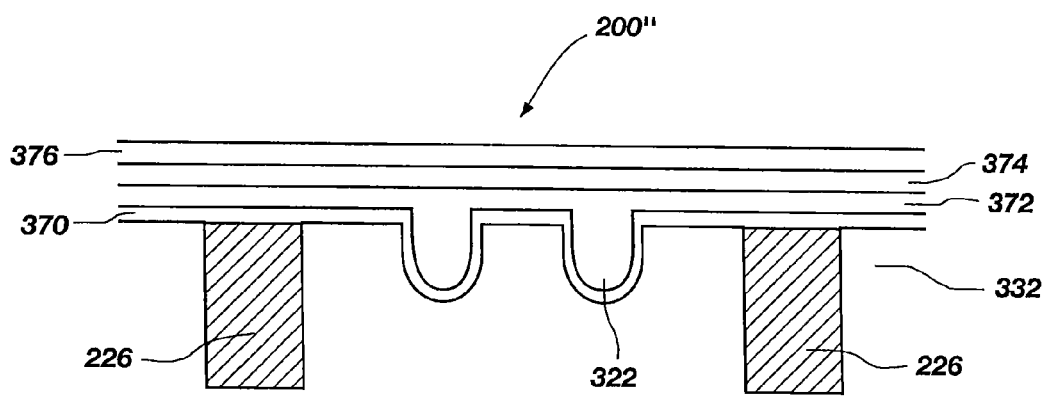
FIG. 15 is a cross-sectional view of an embodiment of a semiconductor structure at a stage in processing subsequent to that illustrated in FIG. 14B.

Referring to FIG. 15, after forming the second trenches 322, a gate oxide material 370 may be grown by conventional methods. Next, various blanket transistor gate materials may be formed by conventional methods to form the semiconductor structure 200" of FIG. 15. The blanket transistor gate materials may be formed from materials of suitable work functions, such as doped polysilicon 372 or a metal, i.e., TiN, a conductor 374, for example tungsten, and a nitride capping material 376. The semiconductor structure 200" may be subjected to further conventional processing to produce transistors in the second trenches 322.

Figure 16:
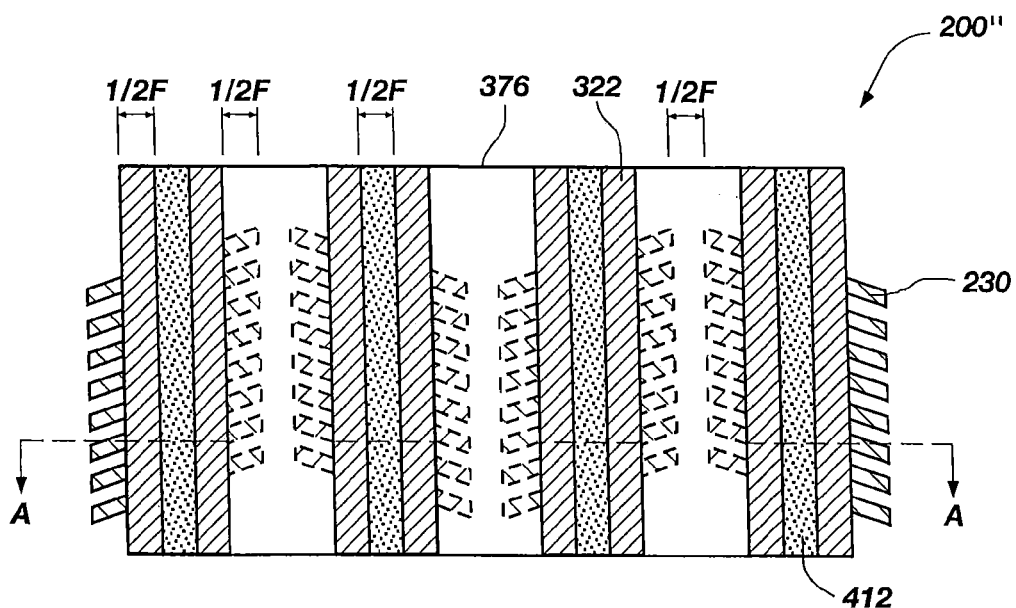
FIG. 16 is a top view of an embodiment of a semiconductor structure at a stage in processing subsequent to that illustrated in FIG. 15.

The semiconductor structure 200" of FIG. 15 may be subjected to further processing, as shown in FIG. 16. By way of non-limiting example, the semiconductor structure 200" may be subject to pitch doubling to form connections to the transistor gates via wordlines (i.e., conductive lines). A first expendable material 412 may be deposited over the semiconductor structure 200". The first expendable material 412 may be patterned by conventional methods or methods described herein to expose the underlying second trenches 322.

Figure 17:
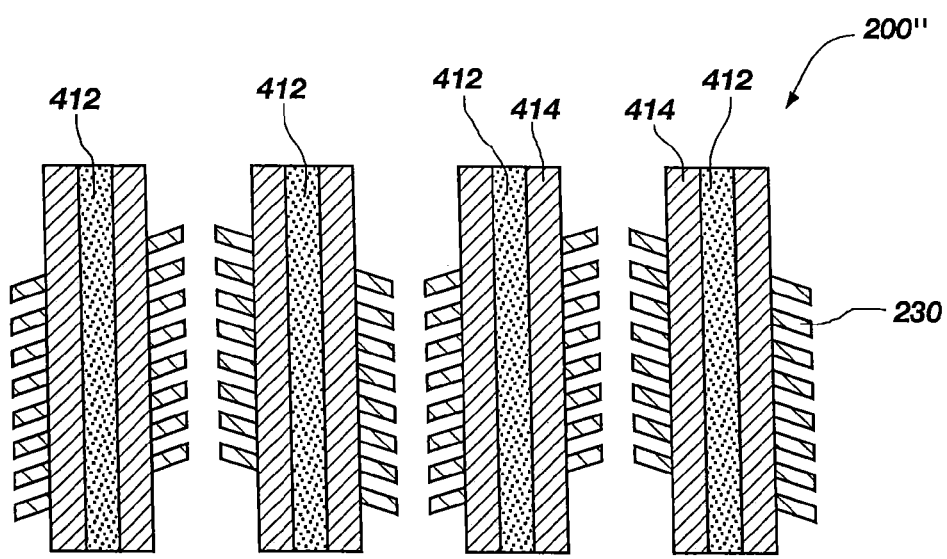
FIGS. 17 and 18A are top views of embodiments of semiconductor structures during various stages of fabrication.
Figure 18A:
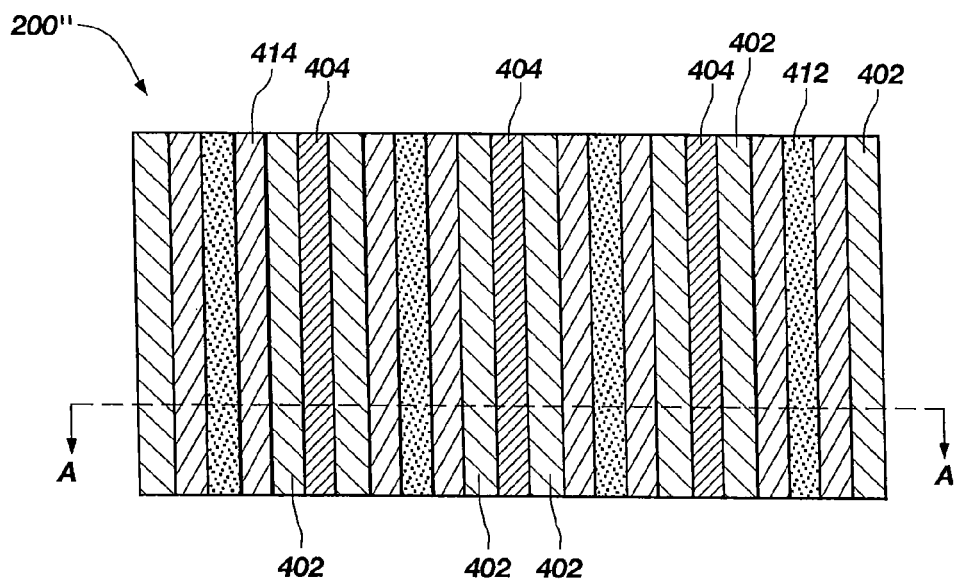
Figure 18B:
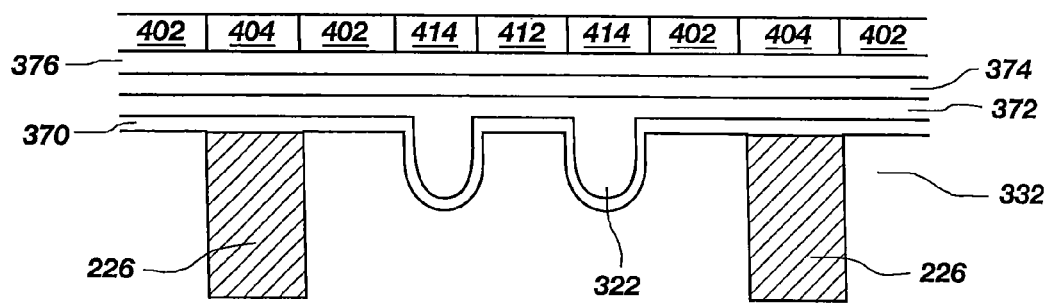
FIG. 18B is a cross-sectional view of the semiconductor structure of FIG. 18A taken along the dashed line labeled A.

Referring to FIG. 17, a first spacer material 414 may be deposited over the semiconductor structure 200". The first spacer material 414 may be planarized and trimmed by conventional methods. The thickness of the first spacer material 414 may define the critical dimension of the transistor gate. Referring to FIG. 18, a second expendable material 402 may be deposited over the semiconductor structure 200" and planarized to expose the first spacer material 414 and first expendable material 412. The second expendable material 402 may be trimmed to a desired width selected to leave an opening in similar width to the first spacer material 414. Next, a second spacer material 404 may be deposited over the semiconductor structure 200" and planarized to expose the first spacer material 414, first expendable material 412 and second expendable material 402, as shown in FIG. 18. The thickness of the second spacer material 404 may define the critical dimensions of the grounded gate. The first spacer material 414 and the second spacer material 404 may have a sub-lithographic width.

Figure 19:
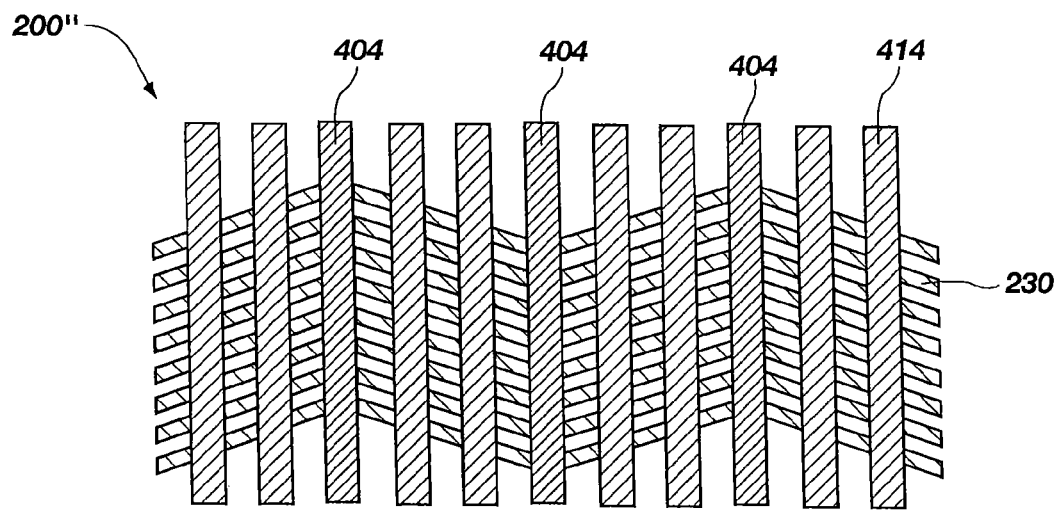
FIGS. 19 and 20 are top views of embodiments of semiconductor structures during various stages of fabrication.
Figure 20:
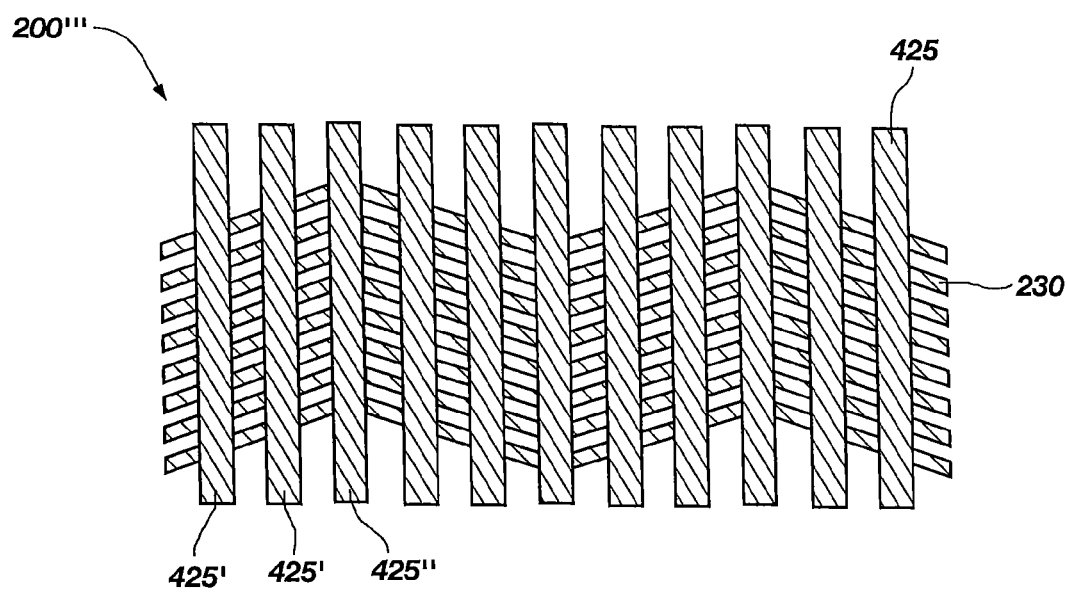

As shown in FIG. 19, the first expendable material 412 and second expendable material 402 may be selectively removed by conventional techniques. In an embodiment of the invention, the first expendable material 412 and second expendable material 402 are amorphous carbon and are removed by conventional methods, e.g., by using a $SO_2$-containing plasma. Then, the first spacer material 414 and second spacer material 404 may function as masks during a conventional etch to form conductive lines 425, as shown in FIG. 20. The conductive lines 425 may function as wordlines 425' and grounded gate 425". The gap between neighboring wordlines 425' is asymmetrical as compared to the gap between the underlying active areas. In an embodiment of the present invention, the conductive lines 425 have a sub-lithographic width.

Numerous advantages are achieved by utilizing the methods of embodiments of the invention to form the semiconductor structures 200', 200", 200'''. The methods described herein accommodate pitch doubling of $6F^2$ architecture at array gate patterning. The methods described herein accommodate the $6F^2$ architecture to be scaled significantly without scaling the lithography required. As such, sub-lithographic features may be formed independent of photolithography and etch trim capabilities. Further, the methods of embodiments of the invention provide for pitch doubling of asymmetric features on non-equal line space. It will be understood that the methods described herein may also be used during other fabrication processes, for example, to define the linear self-aligned contact features, such as capacitors, digit lines or other sub-lithographic features. The semiconductor structures 200', 200''' may be subjected to conventional processing acts to produce the memory array 100 shown in FIG. 2. Since the additional processing acts to form the memory array 100 are conventional, these acts are not described in detail herein.

The invention is susceptible to various modifications and alternative forms in addition to specific embodiments shown by way of example in the drawings and described in detail herein. Thus, the invention is not limited to the particular forms disclosed. Rather, the scope of the invention encompasses all modifications and alternatives falling within the following appended claims and their legal equivalents.

What is claimed is:

1. A semiconductor structure comprising:
a plurality of silicon pillars in a substrate; and
a plurality of trenches isolating each silicon pillar of the plurality of silicon pillars, wherein the plurality of trenches and the plurality of silicon pillars have equal width of less than 44 nm.

2. A semiconductor structure comprising a plurality of active areas separated by isolation regions, the plurality of active areas including recessed access device trenches therein respectively having a width of less than a minimum feature size, a transistor gate being within individual of the recessed access device trenches, the width of the plurality of active areas laterally outward of the transistor gates being less than the minimum feature size.

3. The semiconductor structure of claim 2, wherein the width of the isolation regions is less than the minimum feature size.

4. A semiconductor structure comprising:
a plurality of active areas separated by isolation regions, the plurality of active areas including recessed access device trenches therein respectively having a width of less than a minimum feature size;
conductive gate material within the recessed access device trenches; and
a plurality of conductive lines elevationally outward of the plurality of active areas and recessed access device trenches, some of the conductive lines connecting with the conductive gate material within the recessed access device trenches.

5. The semiconductor structure of claim 1, wherein the trenches comprise insulative material therein.

6. The semiconductor structure of claim 5, wherein the insulative material fills the trenches.

7. The semiconductor structure of claim 4, wherein the conductive lines have widths of less than the minimum feature size.

8. The semiconductor structure of claim 4, wherein the conductive lines run parallel the recessed access device trenches.

9. A semiconductor structure comprising a plurality of active areas separated by isolation regions, the plurality of active areas including recessed access device trenches therein respectively having a width of less than a minimum feature size, conductive gate material within the recessed access device trenches; and
a plurality of conductive lines elevationally outward of the plurality of active areas and recessed access device trenches, some of the conductive lines connecting with the conductive gate material within the recessed access device trenches, another some of the conductive lines not connecting with the conductive gate material within the recessed access device trenches.

10. The semiconductor structure of claim 9, wherein the another some of the conductive lines have widths of less than the minimum feature size.

11. The semiconductor structure of claim 9, wherein the another some of the conductive lines comprise grounded gate lines.

12. The semiconductor structure of claim 11, wherein the grounded gate lines have widths of less than the minimum feature size.

13. A semiconductor structure comprising a plurality of active areas separated by isolation regions, the plurality of active areas including recessed access device trenches therein respectively having a width of less than a minimum feature size, conductive gate material within the recessed access device trenches; and
a plurality of conductive lines elevationally outward of the plurality of active areas and recessed access device trenches, some of the conductive lines connecting with the conductive gate material within the recessed access device trenches, the some of the conductive lines comprising word lines, and further comprising another some of the conductive lines which comprise grounded gate lines, two of the word lines being received between two immediately adjacent of the grounded gate lines.

14. The semiconductor structure of claim 13, wherein the grounded gate lines have widths of less than the minimum feature size.

15. The semiconductor structure of claim 13, wherein the word lines have widths of less than the minimum feature size.

16. The semiconductor structure of claim 13, wherein the word lines have widths of less than the minimum feature size and the grounded gate lines have widths of less than the minimum feature size.

17. The semiconductor structure of claim 2, wherein the isolation regions comprise conductive lines.

18. The semiconductor structure of claim 2, wherein the isolation regions comprise dielectric material.

19. The semiconductor structure of claim 18, wherein the dielectric material comprises oxide.

* * * * *